US012642049B2

(12) United States Patent
Burkhart et al.

(10) Patent No.: US 12,642,049 B2
(45) Date of Patent: May 26, 2026

(54) POWER SOURCE ISOLATION CIRCUITS FOR HEATER ELEMENTS OF SUBSTRATE SUPPORTS OF SUBSTRATE PROCESSING SYSTEMS

(71) Applicant: LAM RESEARCH CORPORATION, Fremont, CA (US)

(72) Inventors: Vincent Burkhart, Cupertino, CA (US); Karl Frederick Leeser, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 1056 days.

(21) Appl. No.: 17/765,470

(22) PCT Filed: Oct. 5, 2020

(86) PCT No.: PCT/US2020/054208
§ 371 (c)(1),
(2) Date: Mar. 31, 2022

(87) PCT Pub. No.: WO2021/071765
PCT Pub. Date: Apr. 15, 2021

(65) Prior Publication Data
US 2022/0367229 A1      Nov. 17, 2022

Related U.S. Application Data

(60) Provisional application No. 62/912,596, filed on Oct. 8, 2019.

(51) Int. Cl.
*H01L 21/683* (2006.01)
*H01J 37/32* (2006.01)
(Continued)

(52) U.S. Cl.
CPC .... *H01L 21/6833* (2013.01); *H01J 37/32724* (2013.01); *H02M 3/1582* (2013.01); *H02M 7/5387* (2013.01)

(58) Field of Classification Search
CPC ......... H01J 37/32724; H01L 21/67103; H01L 21/6831; H01L 21/6833; H02M 3/1582; H02M 7/5387
See application file for complete search history.

(56) References Cited

U.S. PATENT DOCUMENTS 10,050,534 B1 * 8/2018 Murthy-Bellur ........ H02M 3/24
2007/0133241 A1 6/2007 Mumtaz et al.
(Continued)

FOREIGN PATENT DOCUMENTS

CN 103944360 A 7/2014
JP 2012226930 A 11/2012
(Continued)

OTHER PUBLICATIONS

International Search Report and Written Opinion of the ISA issued in PCT/US2020/054208, mailed Feb. 1, 2021; ISA/KR.
(Continued)

*Primary Examiner* — Sang Y Paik

(57) ABSTRACT
A substrate processing system includes a substrate support and a power supply circuit. The substrate support is configured to support a substrate, wherein the substrate support comprises one or more heating elements. The power supply circuit includes: a direct current-to-alternating current converter configured to convert a first direct current voltage to a first alternating current voltage, where the direct current-to-alternating current converter comprises at least one switch; and an isolation circuit comprising one of a coupled inductor or a transformer. The one of the coupled inductor or the transformer is configured to convert the first alternating current voltage to and second alternating current voltage and
(Continued)

isolate the one or more heating elements from an earth ground. The power supply circuit is configured to provide an output voltage to the one or more heating elements based on the second alternating current voltage.

18 Claims, 6 Drawing Sheets

(51) Int. Cl.
*H02M 3/158* (2006.01)
*H02M 7/5387* (2007.01)

(56) References Cited

U.S. PATENT DOCUMENTS

2010/0046252 A1\* 2/2010 Keller ............... H02M 3/33523
363/21.07
2012/0182769 A1 7/2012 Yonezawa et al.

2016/0049323 A1 2/2016 Ye et al.
2017/0125200 A1 5/2017 Burkhart et al.
2017/0162417 A1\* 6/2017 Ye ..................... H01J 37/32091
2017/0363663 A1 12/2017 Breitlow et al.

FOREIGN PATENT DOCUMENTS

WO WO-9945577 A1 9/1999
WO WO-2018213095 A1 11/2018
WO WO-2019083045 A1 5/2019

OTHER PUBLICATIONS

Notice of Allowance issued in Corresponding Japanese Patent App. No. 2022521071 dated Jun. 18, 2024.
Office Action issued in Corresponding Taiwanese Patent App. No. 109134726 mailed May 5, 2024.
Office Action issued in Corresponding Chinese Application No. 2020800708536 dated Dec. 24, 2024.

\* cited by examiner

POWER SOURCE ISOLATION CIRCUITS FOR HEATER ELEMENTS OF SUBSTRATE SUPPORTS OF SUBSTRATE PROCESSING SYSTEMS

CROSS-REFERENCE TO RELATED APPLICATIONS

This application is a U.S. National Phase Application under 35 U.S.C. 371 of International Application No. PCT/US2020/054208, filed on Oct. 5, 2020, which claims the benefit of U.S. Provisional Application No. 62/912,596, filed on Oct. 8, 2019. The entire disclosures of the applications referenced above are incorporated herein by reference.

FIELD

The present disclosure relates to electrostatic chucks of substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system, such as a plasma enhanced chemical vapor deposition (PECVD) processing system, typically includes a showerhead and a substrate support for supporting a substrate. During operation, the shower head distributes reactant gas above the substrate. A radio frequency (RF) potential is provided between two electrodes (e.g., the showerhead and an RF electrode in the substrate support) to generate plasma. Energized electrons ionize or dissociate reactant gases from the plasma, creating chemically reactive radicals. As these radicals react, a thin film is deposited and formed on the substrate.

Arcing can occur between the substrate and the substrate support, showerhead, or chamber body when, for example, non-conductive gas breaks down and an electrical current discharge occurs across a gap between the substrate and the substrate support. Arcing can degrade and/or cause damage to sensitive circuitry in the substrate. This reduces processing yields resulting in manufacturing loses and increased costs.

SUMMARY

A substrate processing system is provided and includes a substrate support and a power supply circuit. The substrate support is configured to support a substrate. The substrate support includes one or more heating elements. The power supply circuit includes: a direct current-to-alternating current converter configured to convert a first direct current voltage to a first alternating current voltage, where the direct current-to-alternating current converter includes at least one switch; and an isolation circuit including one of a coupled inductor or a transformer. The one of the coupled inductor or the transformer is configured to convert the first alternating current voltage to and second alternating current voltage and isolate the one or more heating elements from an earth ground. The power supply circuit is configured to provide an output voltage to the one or more heating elements based on the second alternating current voltage.

In other features, the isolation circuit is configured to supply the second alternating current voltage to the one or more heating elements.

In other features, the substrate processing system further includes a controller. The direct current-to-alternating current converter includes a switch and a primary winding of the one of the coupled inductor or the transformer. The controller is configured to transition the switch between ON and OFF states at a predetermined frequency when providing power to the one or more heating elements. In other features, the predetermined frequency is between 10 kilo-Hertz and 100 kilo-Hertz.

In other features, the substrate processing system further includes a first alternating current-to-direct current converter configured to convert the second alternating current voltage to a second direct current voltage and provide the second direct current voltage to the one or more heating elements.

In other features, the one of the coupled inductor or the transformer and the alternating current-to-direct current converter provide a buck converter. The transformer is a step-down transformer.

In other features, the one of the coupled inductor or the transformer and the alternating current-to-direct current converter provide a boost converter; and the transformer is a step-up transformer.

In other features, the direct current-to-alternating current converter includes a metal-oxide-semiconductor field effect transistor connected in series with a primary coil of the one of the coupled inductor or the transformer. The alternating current-to-direct current converter includes: a diode connected in series with a secondary winding of the one of the coupled inductor or the transformer; and a capacitor connected in parallel with the one or more heating elements and across the secondary winding and the diode.

In other features, the one of the coupled inductor or the transformer includes a primary winding and a secondary winding. The primary winding is connected to the earth ground. The secondary winding is not connected to the earth ground.

In other features, the substrate processing system further includes a controller. The direct current-to-alternating current converter includes an H-bridge. The H-bridge includes a first switch, a second switch, a third switch, and a fourth switch. The controller is configured to transition the first switch, the second switch, the third switch, and the fourth switch between ON and OFF states when providing power to the one or more heating elements.

In other features, the controller is configured to: transition the first switch and the fourth switch to an ON state while transitioning the second switch and the third switch to an OFF state; and transition the first switch and the fourth switch to an OFF state while transitioning the second switch and the third switch to an ON state.

In other features, the first switch and the second switch are connected in series. The third switch and the fourth switch are connected in series and together are connected in parallel with the series combination of the first switch and the second switch.

In other features, the first switch and the second switch are connected to a first end of a primary winding of the one of the coupled inductor or the transformer. The third switch and the fourth switch are connected to a second end of a primary winding of the one of the coupled inductor or the transformer.

In other features, the substrate processing system further includes an alternating current-to-direct current converter configured to convert the second alternating current voltage to a second direct current voltage and provide the second direct current voltage to the one or more heating elements. The primary winding receives the first alternating current voltage. A secondary winding of the one of the coupled inductor or the transformer supplies the second alternating current voltage to the first alternating current-to-direct current converter.

In other features, the substrate processing system further includes an alternating current-to-direct current converter configured to convert the second alternating current voltage to a second direct current voltage and provide the second direct current voltage to the one or more heating elements. The alternating current-to-direct current converter includes: a diode connected in series with a secondary winding of the one of the coupled inductor or the transformer; and a capacitor connected in parallel with the one or more heating elements and across the secondary winding and the diode.

In other features, the substrate processing system further includes a first alternating current-to-direct current converter configured to convert the second alternating current voltage to a second direct current voltage and provide the second direct current voltage to the one or more heating elements. The one or more heating elements include a first heating element. The one of the coupled inductor or the transformer includes a primary winding and a first secondary winding. The first alternating current-to-direct current converter is connected to the first secondary winding and provides the second alternating current voltage to the first heating element.

In other features, the substrate processing system further includes a second alternating current-to-direct current converter. The one or more heating elements include a second heating element. The one of the coupled inductor or the transformer includes a second secondary winding. The second alternating current-to-direct current converter converts the first alternating current voltage to a third alternating current voltage and provides the third alternating current voltage to the second heating element.

In other features, a substrate processing system is provided and includes a substrate support, a power supply circuit and a controller. The substrate support is configured to support a substrate. The substrate support includes one or more heating elements. The power supply circuit includes: a switch configured to receive a first direct current voltage; one of a coupled inductor or a transformer including a primary winding and a secondary winding, where the primary winding is connected to the switch and an earth ground, and where the secondary winding is not connected to the earth ground; a diode connected in series with the secondary winding; and a capacitor connected to the diode and in parallel with the one or more heating elements. The diode and the capacitor convert an alternating current output of the secondary winding to a second direct current voltage. The capacitor provides the second direct current voltage to the one or more heating elements. The controller is configured to transition the switch between an ON state and an OFF state at a predetermined frequency when powering the one or more heating elements.

In other features, the substrate processing system further includes a second capacitor. The first direct current voltage is received across the second capacitor. The switch is connected to an output end of the second capacitor.

In other features, a substrate processing system is provided and includes: a substrate support configured to support a substrate. The substrate support includes one or more heating elements. The substrate processing system further includes a power supply circuit and a controller. The power supply circuit includes: an H-bridge configured to receive a first direct current voltage, where the H-bridge includes a first switch, a second switch, a third switch, and a fourth switch; one of a coupled inductor or a transformer including a primary winding and a secondary winding, where the primary winding is connected to the H-bridge and an earth ground, and where the secondary winding is not connected to the earth ground; a diode connected in series with the secondary winding; and a capacitor connected to the diode and in parallel with the one or more heating elements. The diode and the capacitor convert an alternating current output of the secondary winding to a second direct current voltage. The capacitor provides the second direct current voltage to the one or more heating elements. The controller is configured to transition the first switch, the second switch, the third switch, and the fourth switch between an ON state and an OFF state at a predetermined frequency when powering the one or more heating elements.

In other features, the first switch and the second switch are connected in series. The third switch and the fourth switch are connected in series and together are connected in parallel with the series combination of the first switch and the second switch. The first switch and the second switch are connected to a first end of a primary winding of the one of the coupled inductor or the transformer. The third switch and the fourth switch are connected to a second end of a primary winding of the one of the coupled inductor or the transformer.

In other features, the substrate processing system further includes a second capacitor configured to receive the first direct current voltage. The second capacitor is: connected in parallel with the series combination of the first switch and the second switch; and connected in parallel with the series combination of the third switch and the fourth switch.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

In PECVD and plasma enhanced atomic layer deposition (PEALD) processing systems, a substrate support is disposed in a processing chamber and may include one or more heating elements embedded within the substrate support. The substrate support may be formed of, for example, aluminum nitride ($AlN_3$). The heating elements are used to set processing temperatures of the substrate support and the temperature of a substrate resting on the substrate support. AC power may be provided to supply power to the heating elements. For example, the AC power may have a frequency of 50-60 Hertz (Hz). The AC power is referenced to an earth ground for standard safety code reasons. Walls of the processing chamber may be connected to earth ground.

As a temperature of a substrate support increases, the substrate support can become more conductive. This is true of a substrate support formed of $AlN_3$. As a result current can leak from the heating elements disposed in the substrate support through a portion of the substrate support to the substrate and then to plasma, where the current can then be passed to earth ground via a showerhead and/or chamber wall. As a result, arcing can occur, for example, between the substrate support and the substrate, the substrate support to showerhead, or substrate support to chamber walls which can degrade the substrate.

The examples disclosed herein include power supply circuits including isolation circuits for supplying power to heating elements within substrate supports. The isolation circuits isolate the heating elements from earth ground and minimize and/or prevent arcing between the substrate supports and substrates due to current leaking from the heating elements. The power supply circuits also implement high-speed switching, which allows for smaller magnetics and thus use of, for example, small transformers in the isolation circuits. The transformers are considerably smaller and cost less than transformers that would otherwise be required to isolate, for example, a 60 Hz AC signal from an earth ground. As a result, the disclosed examples, including a combination of the high-speed switching and the isolation circuits, allow for use of small power supply circuits.

Figure 1:
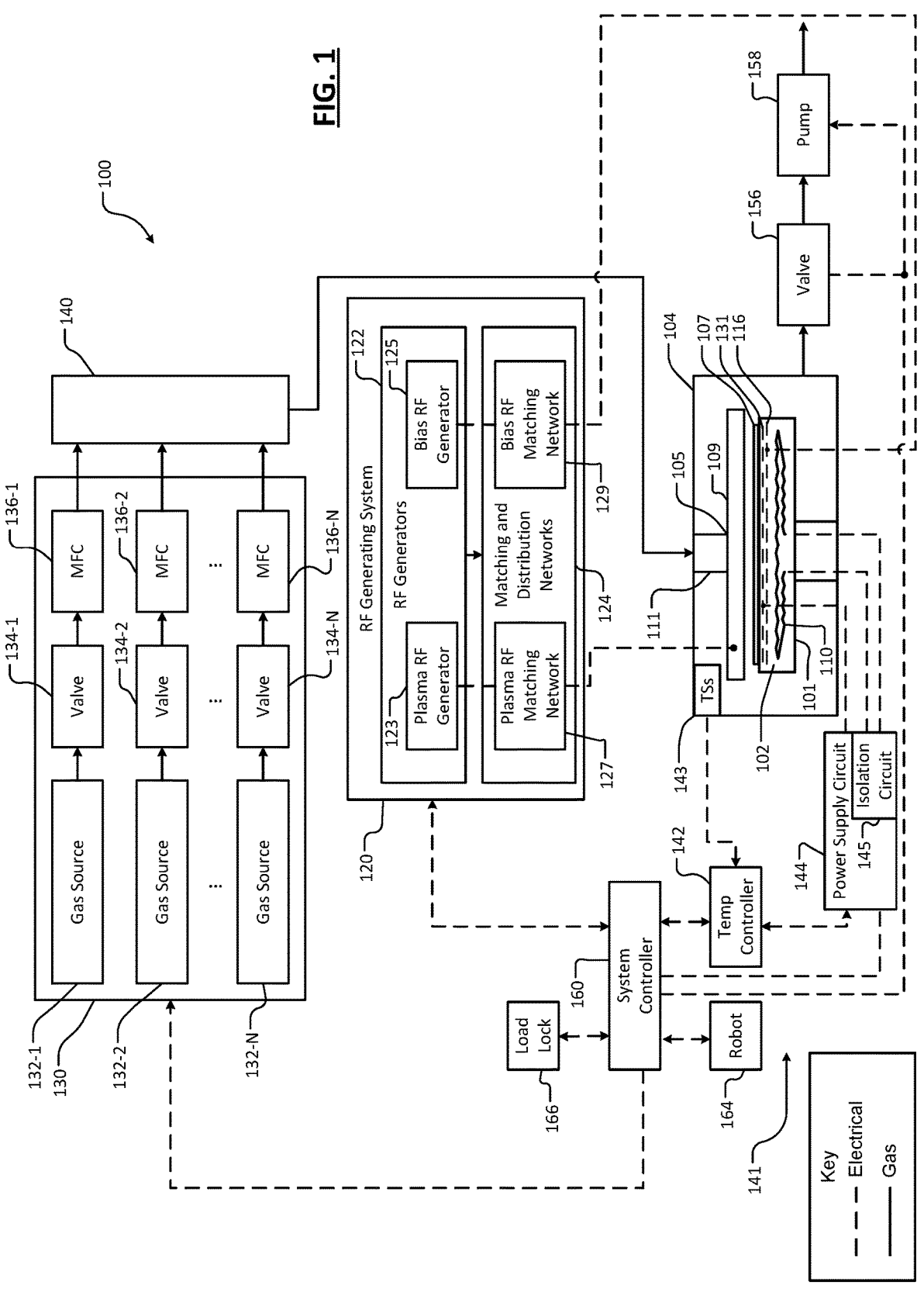
FIG. 1 is a functional block diagram of an example of a substrate processing system incorporating an isolation circuit for one or more heating elements of a substrate support in accordance with an embodiment of the present disclosure.

FIG. 1 shows a substrate processing system 100 that includes an ESC 101. The ESC 101 may be configured the same or similarly as any of the substrate supports disclosed herein. Although FIG. 1 shows a capacitive coupled plasma (CCP) system, the embodiments disclosed herein are applicable to transformer coupled plasma (TCP) systems, inductively coupled plasma (ICP) systems and/or other systems and plasma sources that include a substrate support having heating elements. The embodiments are applicable to plasma vapor deposition (PVD) processes, PECVD processes, PEALD processes, chemically enhanced plasma vapor deposition (CEPVD) processes. Although the ESC 101 is shown as including a monolithic body 102, the ESC may have other structures including multi-plate substrate supports. The body 102 may be formed of different materials and/or different ceramic compositions. The body 102 may include, for example, aluminum nitride ($AlN_3$) and/or other suitable substrate support materials.

The substrate processing system 100 includes a processing chamber 104. The ESC 101 is enclosed within the processing chamber 104. The processing chamber 104 also encloses other components, such as an upper electrode 105, and contains RF plasma. During operation, a substrate 107 is arranged on and electrostatically clamped to the ESC 101. For example only, the upper electrode 105 may include a showerhead 109 that introduces and distributes gases. The showerhead 109 may include a stem portion 111 including one end connected to a top surface of the processing chamber 104. The showerhead 109 is generally cylindrical and extends radially outward from an opposite end of the stem portion 111 at a location that is spaced from the top surface of the processing chamber 104. A substrate-facing surface of the showerhead 109 includes holes through which process or purge gas flows. Alternately, the upper electrode 105 may include a conducting plate and the gases may be introduced in another manner.

Figure 2:
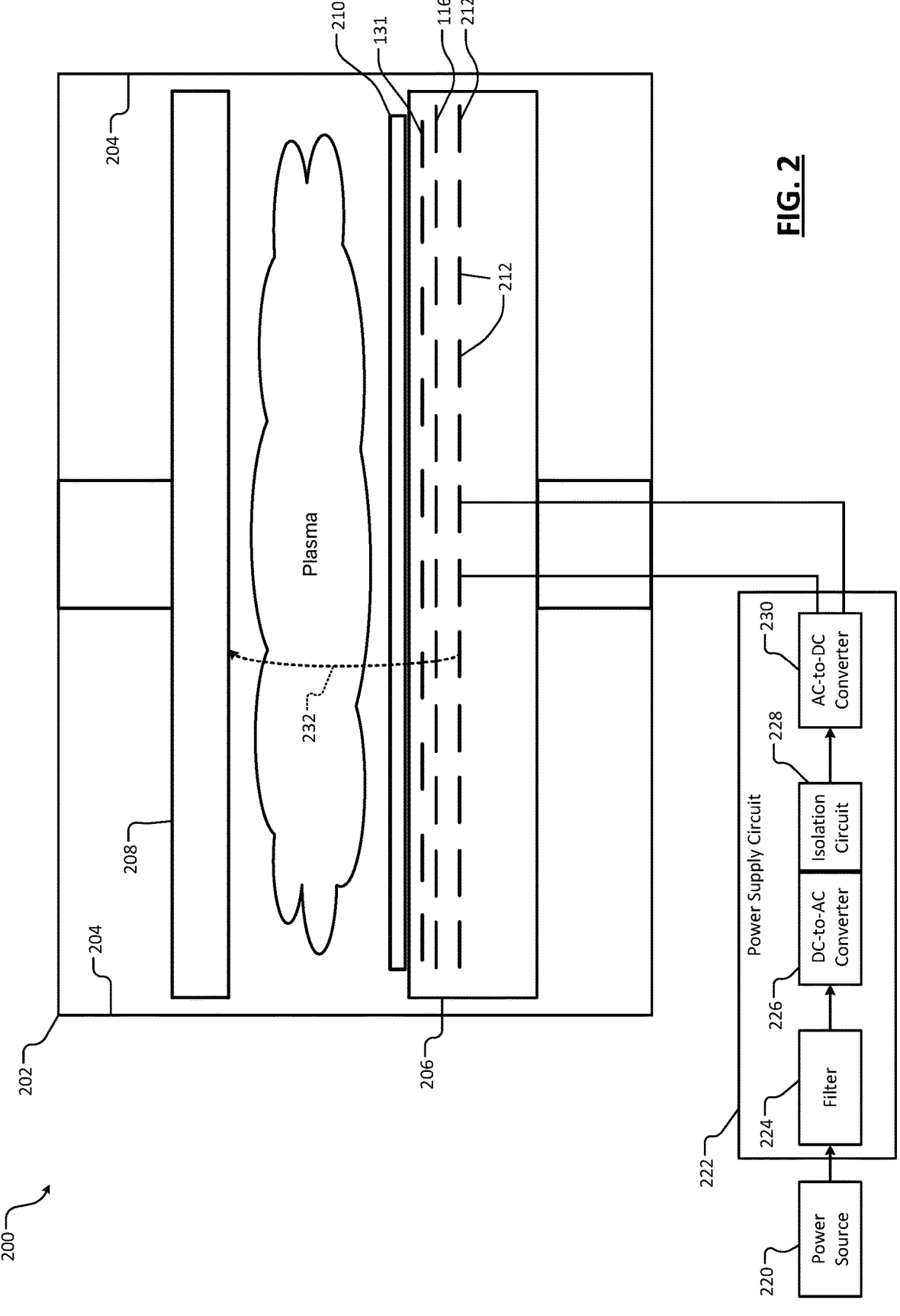
FIG. 2 is a functional block diagram of an example of another substrate processing system illustrating a corresponding power supply circuit in accordance with an embodiment of the present disclosure.

The ESC 101 may include temperature control elements (TCEs) also referred to as heating elements. As an example, FIG. 1 shows the ESC 101 including a single heating element 110. Although a single heating element 110 is shown, any number of heating elements may be included in the ESC 101 (another example is shown in FIG. 2).

An RF generating system 120 generates and outputs RF voltages to the upper electrode 105 and one or more lower electrodes 116 in the ESC 101. One of the upper electrode 105 and the ESC 101 may be DC grounded, AC grounded or at a floating potential. For example only, the RF generating system 120 may include one or more RF generators 122 (e.g., a capacitive coupled plasma RF power generator, a bias RF power generator, and/or other RF power generator) that generate RF voltages, which are fed by one or more matching and distribution networks 124 to the upper electrode 105 and/or the ESC 101. As an example, a plasma RF generator 123, a bias RF generator 125, a plasma RF matching network 127 and a bias RF matching network 129 are shown. The plasma RF generator 123 may be a high-power RF generator producing, for example 6-10 kilo-watts (kW) of power or more. The bias RF matching network supplies power to RF electrodes, such as RF electrodes 116.

A gas delivery system 130 includes one or more gas sources 132-1, 132-2, . . . , and 132-N (collectively gas sources 132), where N is an integer greater than zero. The gas sources 132 supply one or more precursors and gas mixtures thereof. The gas sources 132 may also supply etch gas, carrier gas and/or purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 104. For example only, the output of the manifold 140 is fed to the showerhead 109.

The substrate processing system 100 further includes a heating system 141 that includes a temperature controller 142, which may be connected to the heating element 110. The temperature controller 142 controls a power supply circuit 144, which supplies power to the heating element 110. The power supply circuit 144 includes an isolation circuit 145 that isolates the heating element 110 and corresponding power lines from earth ground and as a result minimizes and/or prevents arcing due to current leaking from the heating element 110. The power supply circuit 144 may be implemented as any of the power supply circuits disclosed herein including that shown in FIGS. 2-5.

Although shown separately from a system controller 160, the temperature controller 142 may be implemented as part of the system controller 160. The ESC 101 may include multiple temperature controlled zones, where each of the zones includes temperature sensors and heating elements. The temperature controller 142 may monitor temperatures as indicated by the temperature sensors and adjust current, voltage and/or power to the heating elements to adjust the temperatures to target temperatures. The power supply circuit 144 may also provide power, including a high voltage, to electrodes 131 to electrostatically clamp the substrate 107 to the ESC 101. The power supply circuit 144 may be controlled by the system controller 160.

The temperature controller 142 may control operation and thus temperatures of heating elements and, as a result, temperatures of a substrate (e.g., the substrate 107). The temperature controller 142 controls current supplied to the heating elements based on detected parameters from temperature sensors 143 within the processing chamber 104. The temperature sensors 143 may include resistive temperature devices, thermocouples, digital temperature sensors, and/or other suitable temperature sensors.

A valve 156 and the pump 158 may be used to evacuate reactants from the processing chamber 104. The system controller 160 may control components of the substrate processing system 100 including controlling supplied RF power levels, pressures and flow rates of supplied gases, RF matching, etc. The system controller 160 controls states of the valve 156 and the pump 158. A robot 164 may be used to deliver substrates onto, and remove substrates from, the ESC 101. For example, the robot 164 may transfer substrates between the ESC 101 and a load lock 166. The robot 164 may be controlled by the system controller 160. The system controller 160 may control operation of the load lock 166.

The valves, gas pumps, power sources, RF generators, etc. referred to herein may be referred to as actuators. The heating elements, gas channels, etc. referred to herein may be referred to as temperature adjusting elements.

FIG. 2 shows a substrate processing system 200 including a processing chamber 202 having chamber walls 204. A substrate support 206 and a showerhead 208 are disposed in the processing chamber 202. The substrate support 206 supports a substrate 210 and includes the clamping electrodes 131, the RF electrodes 116, and heating elements 212. Although (i) the clamping electrodes 131 are shown as being in a single horizontal plane, (ii) the RF electrodes 116 are shown as being in a single horizontal plane, and (iii) the heating elements 212 are shown as being in a single horizontal plane, the electrodes 131, 116 and heating elements 212 may be disposed in other arrangements within the substrate support 206.

Figure 4:
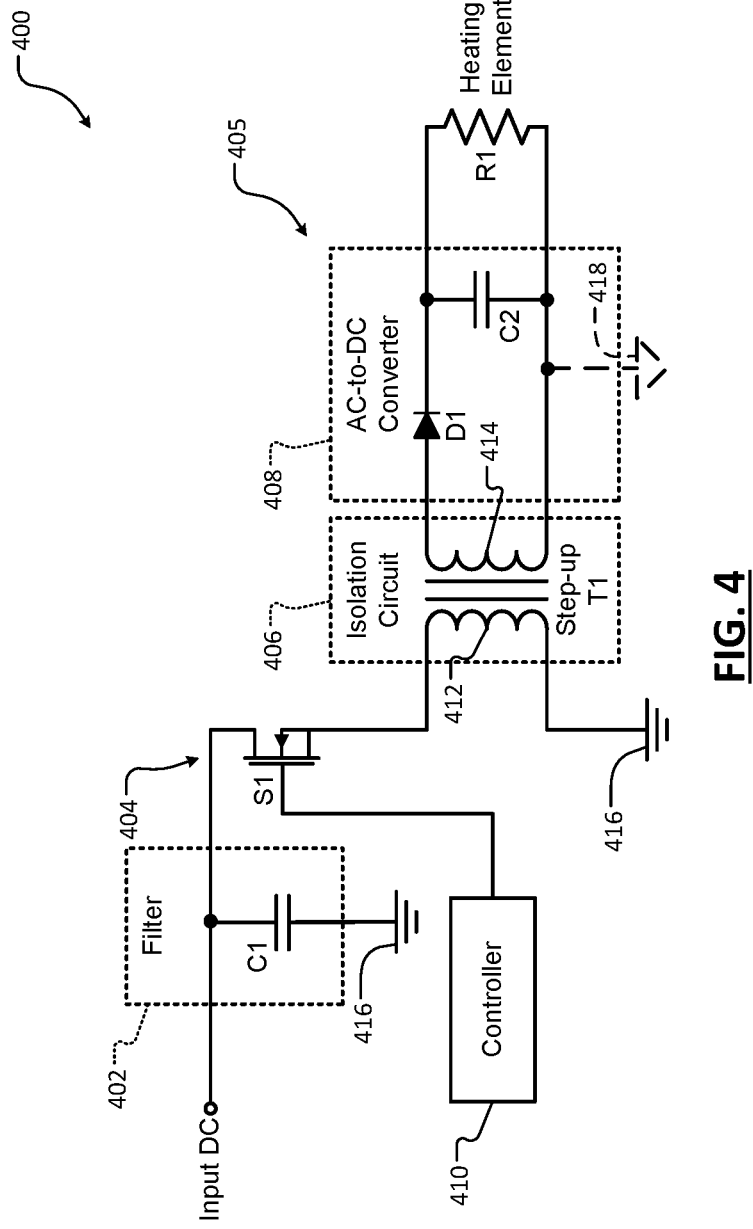
FIG. 4 is a functional block diagram of an example of another power supply circuit including an isolation circuit and a boost converter in accordance with an embodiment of the present disclosure.
Figure 5:
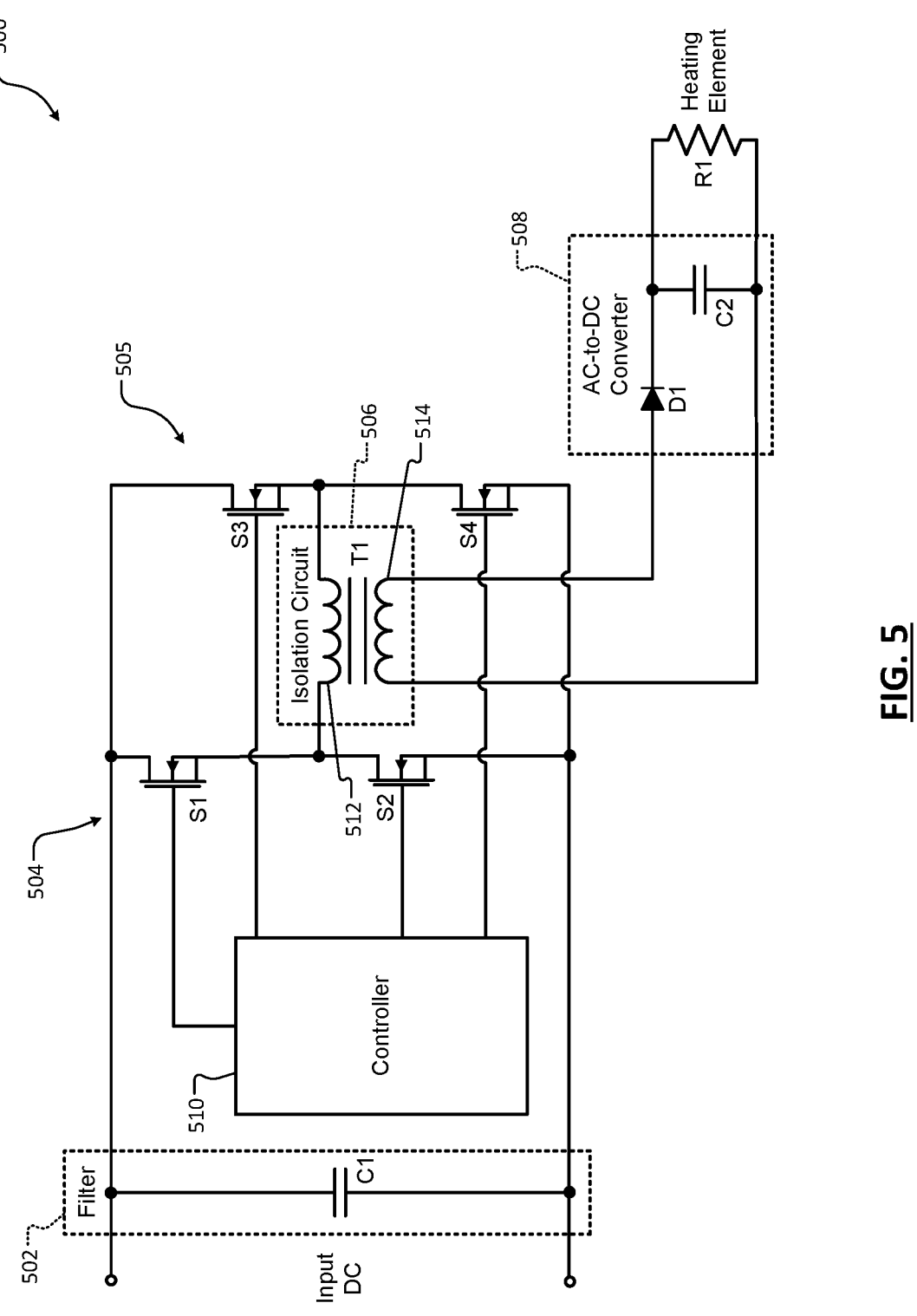
FIG. 5 is a functional block diagram of an example of another power supply circuit including an H-bridge and an isolation circuit in accordance with an embodiment of the present disclosure.

The substrate processing system 200 further includes a power source 220 and a power supply circuit 222, which includes a filter 224, a DC-to-AC converter 226, an isolation circuit 228 and an optional AC-to-DC converter 230. In one embodiment, the AC-to-DC converter 230 is not included and the output of the isolation circuit 228 is provided to the heating elements 212. The isolation circuit 228 may be directly connected to the heating elements 212. The power source 220 supplies a DC voltage to the power supply circuit 222, which is received at the filter 224. The filter 224 removes noise prior to the DC voltage being received at the DC-to-AC converter 226, which converts the DC voltage to a first AC voltage. Examples of the power supply circuit 222, filter 224, DC-to-AC converter 226, isolation circuit 228, and optional AC-to-DC converter 230 are shown in FIG. 3-5.

The isolation circuit 228 isolates the heating elements 212 from the output of the DC-to-AC converter 226 and earth ground. This aids in prevents arcing between the substrate support 206 and the substrate. An example path 232 is shown that current may follow from the heating elements 212 if the disclosed power supply circuit 222 and the like were not implemented. The isolation circuit 228 may include a transformer, which converts the first AC voltage to a second AC voltage. The AC-to-DC converter 230 converts the second AC voltage to one or more DC voltage(s), which are provided to the heating elements 212.

Figure 3:
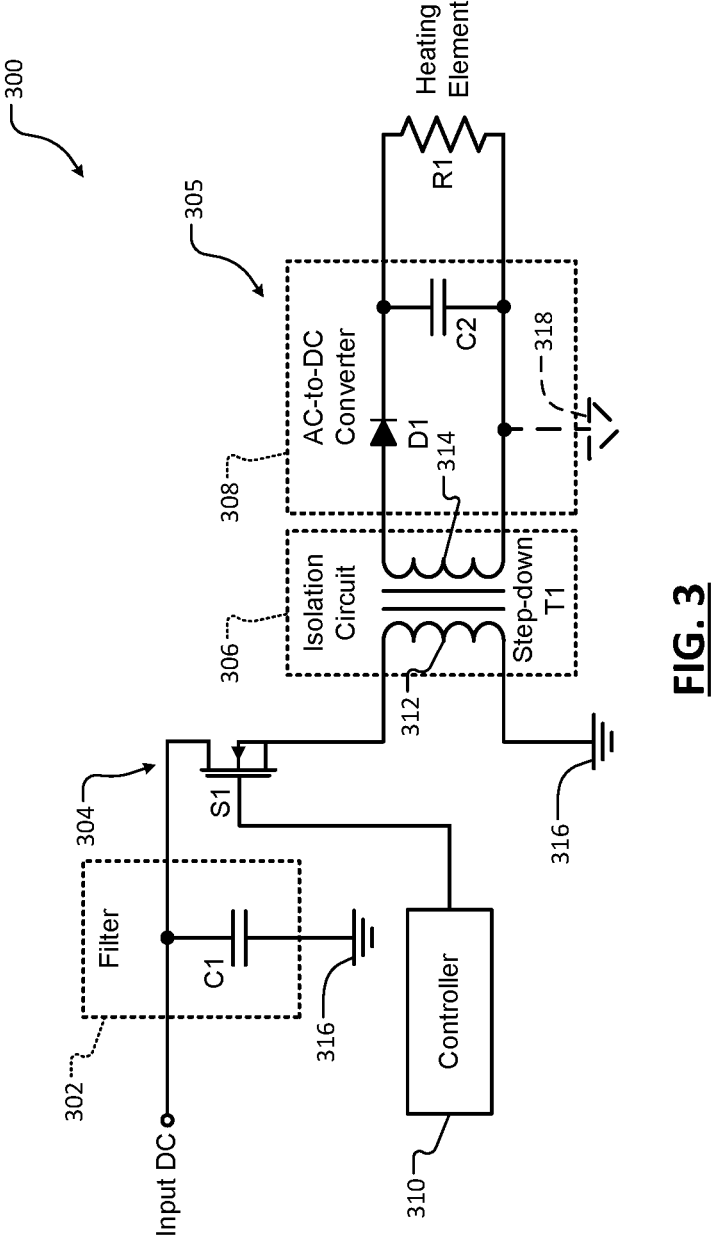
FIG. 3 is a functional block diagram of an example of a power supply circuit including an isolation circuit and a buck converter in accordance with an embodiment of the present disclosure.

FIG. 3 shows a power supply circuit 300 including a filter 302, a DC-to-AC converter 304, and a synchronous buck converter 305, which provides power to a heating element R1. The buck converter 305 includes an isolation circuit 306 and an optional AC-to-DC converter 308. In an embodiment, the AC-to-DC converter 308 is not included and the output of the isolation circuit 306 is provided to the heating element R1. The isolation circuit 306 may be directly connected to the heating element R1. The filter 302 includes a capacitor C1 that receives a first DC voltage at a first end and is connected to an earth ground 316 at a second end. The DC-to-AC converter 304 converts the first DC voltage to a first AC voltage and includes a switch S1 and a primary coil 312 of the isolation circuit 306. The switch S1 may be a metal-oxide-semiconductor field effect transistor (MOSFET) as shown, a bipolar transistor, and/or other suitable switch. A controller 310 controls switching of the switch S1 between ON and OFF states. The controller 310 may be implemented as the temperature controller 142 of FIG. 1 and may transition the switch S1 between the ON and OFF states at a predetermined switching frequency (e.g., 10-100 kilo-Hertz (kHz)) when providing power to the heating element R1. In an embodiment, the switching frequency is 48 kHz. The switching frequency may be greater than 100 kHz. When the switching frequency is greater than 100 kHz, additional filtering components are included.

The isolation circuit 306 includes a transformer T1. The transformer T1 may be replaced with a coupled inductor. The transformer may be implemented as a fly-back-type transformer. In the example shown, the transformer T1 is implemented as a step-down transformer that converts the first AC voltage to a second AC voltage that is less than the first AC voltage. The transformer T1 includes the primary coil 312 and a secondary coil 314. The primary coil 312 is connected in series with the switch S1 and to the earth ground 316. The secondary coil 314 has a first end connected to an anode of a diode D1 of the AC-to-DC converter 308 and a second end that may be connected to a common (or reference) ground 318. The reference ground 318 is not at a same voltage potential as the earth ground 316.

The AC-to-DC converter 308 includes the diode D1 and a capacitor C2. The diode rectifies the second AC voltage to provide a second DC voltage that is provided across the capacitor C2. A first end of the capacitor C2 is connected to a cathode of the diode D1 and a second end of the capacitor is connected to the reference ground 318. The capacitor C2 is connected in parallel with the heating element R1. The heating element R1 receives the second AC voltage.

FIG. 4 shows a power supply circuit 400 including a filter 402, a DC-to-AC converter 404, and a synchronous boost converter 405, which provides power to a heating element R1. The boost converter 405 includes an isolation circuit 406 and an optional AC-to-DC converter 408. In an embodiment, the AC-to-DC converter 408 is not included and the output of the isolation circuit 406 is provided to the heating element R1. The isolation circuit 406 may be directly connected to the heating element R1. The filter 402 includes a capacitor C1 that receives a first DC voltage at a first end and is connected to an earth ground 416 at a second end. The DC-to-AC converter 404 converts the first DC voltage to a first AC voltage and includes a switch S1 and a primary coil 412 of the isolation circuit 406. The switch S1 may be a MOSFET as shown, a bipolar transistor, and/or other suitable switch. A controller 410 controls switching of the switch S1 between ON and OFF states. The controller 410 may be implemented as the temperature controller 142 of FIG. 1 and may transition the switch S1 between the ON and OFF states at a predetermined switching frequency (e.g., 10-100 kilo-Hertz (kHz)) when providing power to the heating element R1. In an embodiment, the switching frequency is 48 kHz. The switching frequency may be greater than 100 kHz. When the switching frequency is greater than 100 kHz, additional filtering components are included.

The isolation circuit 406 a transformer T1. The transformer T1 may be replaced with a coupled inductor. The transformer may be implemented as a fly-back-type transformer. In the example shown, the transformer T1 is implemented as a step-up transformer that converts the first AC voltage to a second AC voltage that is greater than the first AC voltage. The transformer T1 includes the primary coil 412 and a secondary coil 414. The primary coil 412 is connected in series with the switch S1 and to the earth ground 416. The secondary coil 414 has a first end connected to an anode of a diode D1 of the optional AC-to-DC converter 408 and a second end that may be connected to a common (or reference) ground 418. The reference ground 418 is not at a same voltage potential as the earth ground 416.

The AC-to-DC converter 408 includes the diode D1 and a capacitor C2. The diode rectifies the second AC voltage to provide a second DC voltage that is provided across the capacitor C2. A first end of the capacitor C2 is connected to a cathode of the diode D1 and a second end of the capacitor is connected to the reference ground 418. The capacitor C2 is connected in parallel with the heating element R1. The heating element R1 receives the second AC voltage.

FIG. 5 shows a power supply circuit 500 a filter 502, a DC-to-AC converter 504, an isolation circuit 506, and an optional AC-to-DC converter 508, which provides power to a heating element R1. In an embodiment, the AC-to-DC converter 508 is not included and the output of the isolation circuit 506 is provided to the heating element R1. The isolation circuit 506 may be directly connected to the heating element R1. The filter 502 includes a capacitor C1 that is connected across input terminals and receives a first DC voltage. The DC-to-AC converter 504 converts the first DC voltage to a first AC voltage and includes an H-bridge 505, a controller 510 and a primary coil 512 of the isolation circuit 506.

The H-bridge includes switches S1-S4, which may be implemented as MOSFET switches as shown, bipolar transistors, and/or other suitable switches. The controller 510 controls switching of the switches S1-S4 between ON and OFF states. The controller 510 may be implemented as the temperature controller 142 of FIG. 1. The controller 510 generates control signals that are provided to gates of the switches S1-S4 and transition the switches S1-S4 between the ON and OFF states at a predetermined switching frequency (e.g., 10-100 kilo-Hertz (kHz)) when providing power to the heating element R1. In an embodiment, the switching frequency is 48 kHz. The switching frequency may be greater than 100 kHz. When the switching frequency is greater than 100 kHz, additional filtering components may be included. The switches S1 and S4 may be in an ON state while the switches S2 and S3 are in an OFF state. Similarly, the switches S2 and S3 may be in an OFF state while the switches S1 and S4 are in an ON state.

The switches S1 and S2 are connected in series and the S1-S2 series combination is connected in parallel with the capacitor C1. The switches S3 and S4 are connected in series and the S3-S4 series combination is connected in parallel with the capacitor C1. The transformer T1 may be replaced with a coupled inductor.

The DC-to-AC converter 504 converts the first DC voltage to a first AC voltage that is provided at the primary coil 512. A first end of the primary coil 512 is connected to a source of the switch S1 and to a drain of the switch S2 and a second end connected to a source of the switch S3 and to a drain of the switch S4. The isolation circuit 506 includes a transformer T1 having the primary coil 512 and a secondary coil 514. The transformer T1 converts a first AC voltage to a second AC voltage. The transformer T1 may be a step-down transformer or a step-up transformer.

The AC-to-DC converter 408 includes the diode D1 and a capacitor C2. The secondary coil 514 has a first end connected to an anode of the diode D1 and a second end connected to a capacitor C2. The diode D1 rectifies the second AC voltage to provide a second DC voltage that is provided across the capacitor C2. A first end of the capacitor C2 is connected to a cathode of the diode D1 and a second end of the capacitor is connected to the secondary coil 514. The capacitor C2 is connected in parallel with the heating element R1. The heating element R1 receives the second AC voltage.

In one embodiment, the power supply circuits 222, 300, 400, 500 of FIGS. 2-5 are provided for each heating element of a substrate support. In another embodiment, each of the transformers T1 of the power supply circuits 222, 300, 400, 500 includes multiple secondary coils that provide AC voltages to respective AC-to-DC converters and respective heating elements. In another embodiment, each of the AC-to-DC converters of the stated embodiments provides current to one or more heating elements. An example is shown in FIG. 6.

Figure 6:
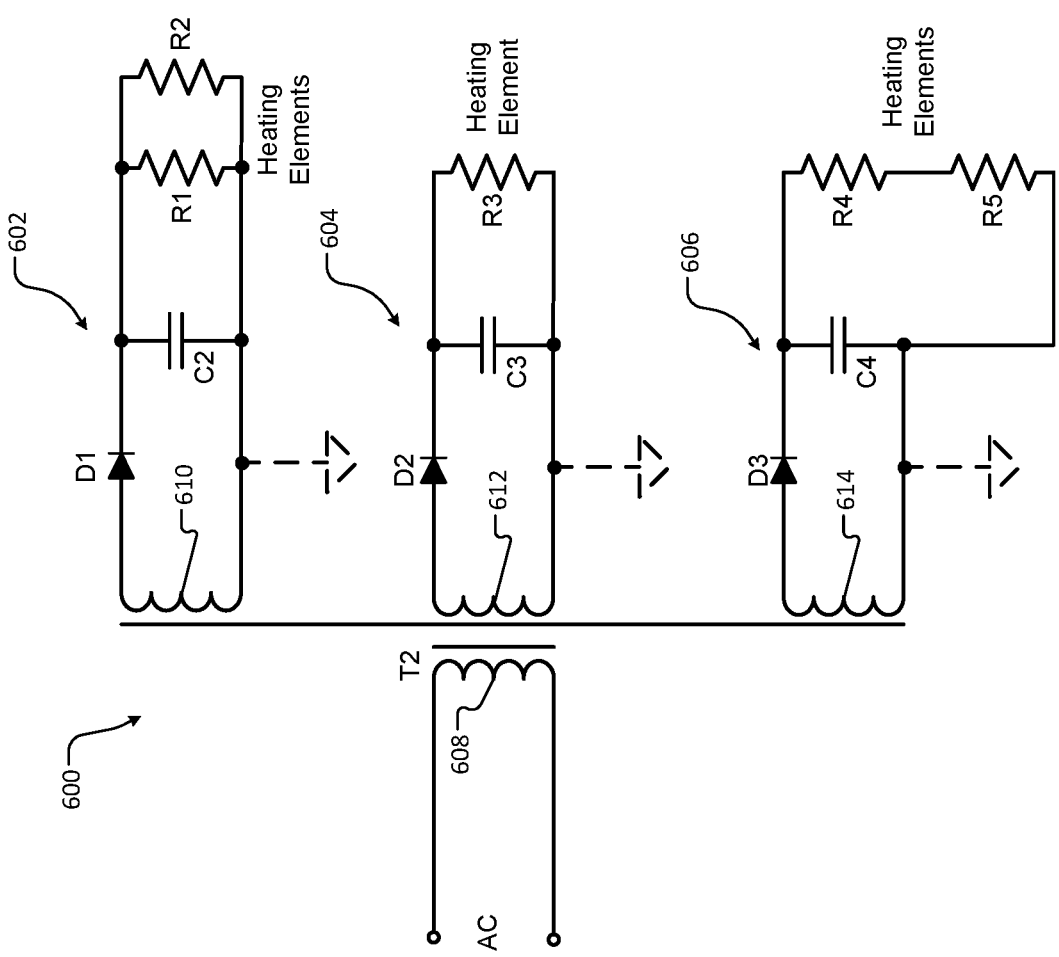
FIG. 6 is a functional block diagram of an example of an isolation circuit and multiple alternating current (AC)-todirect current (DC) converters in accordance with an embodiment of the present disclosure.

FIG. 6 shows an isolation circuit 600 and multiple AC-to-DC converters 602, 604, 606. The isolation circuit 600 includes a transformer T2, which may replace any of the transformers T1 of FIGS. 2-5 or a coupled inductor. The transformer T2 includes a primary coil 608 and secondary coils 610, 612, 614. Although the transformer T2 is shown having three secondary coils, the transformer T2 may have any number of secondary coils. The transformer T2 converts a first AC voltage to one or more other AC voltages. The one or more other AC voltages are provided to the AC-to-DC converters 602, 604, 606. The AC-to-DC converters 602, 604, 606 may receive a same AC voltage or different AC voltages. The secondary coils 610, 612, 614 may have a same number of windings or a different number of windings.

The AC-to-DC converters 602, 604, 606 include respective diodes D1-D3 and capacitors C2-C4 and convert received AC voltages to second DC voltages, which are provided to one or more heating elements (e.g., heating elements R1-R5). The heating elements of each of the AC-to-DC converters 602, 604, 606 may be connected in series and/or in parallel. Although certain series and parallel arrangements are shown, other series and/or parallel arrangements may be included. Each of the AC-to-DC converters 602, 604, 606 may include any number of heating elements.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system comprising:
a substrate support configured to support a substrate, wherein the substrate support comprises one or more heating elements; and a power supply circuit comprising an input, a direct current-to-alternating current converter configured to convert a first direct current voltage received from the input to a first alternating current voltage, wherein the direct current-to-alternating current converter comprises at least one switch, and an isolation circuit comprising one of a coupled inductor or a transformer, wherein the one of the coupled inductor or the transformer is configured to convert the first alternating current voltage to and second alternating current voltage and isolate the one or more heating elements from an earth ground, wherein the power supply circuit is configured to provide an output voltage to the one or more heating elements based on the second alternating current voltage, a primary coil of the one of the coupled inductor or the transformer is directly connected to the earth ground and is not connected to a reference ground, a secondary coil of the one of the coupled inductor or the transformer is connected to the reference ground and is not connected to the earth ground, the reference ground is at a different voltage potential than the earth ground, and the at least one switch is connected between the input and the primary coil and supplies the first alternating current voltage to the primary coil.

2. The substrate processing system of claim 1, wherein the isolation circuit is configured to supply the second alternating current voltage to the one or more heating elements.

3. The substrate processing system of claim 1, further comprising a controller, wherein:

the direct current-to-alternating current converter comprises a switch and the primary coil of the one of the coupled inductor or the transformer; and the controller is configured to transition the switch between ON and OFF states at a predetermined frequency when providing power to the one or more heating elements.

4. The substrate processing system of claim 3, wherein the predetermined frequency is between 10 kilo-Hertz and 100 kilo-Hertz.

5. The substrate processing system of claim 1, further comprising an alternating current-to-direct current converter configured to convert the second alternating current voltage to a second direct current voltage and provide the second direct current voltage to the one or more heating elements.

6. The substrate processing system of claim 5, wherein:

the one of the coupled inductor or the transformer and the alternating current-to-direct current converter provide a buck converter; and the transformer is a step-down transformer.

7. The substrate processing system of claim 5, wherein:

the one of the coupled inductor or the transformer and the alternating current-to-direct current converter provide a boost converter; and the transformer is a step-up transformer.

8. The substrate processing system of claim 5, wherein:

the direct current-to-alternating current converter comprises a metal-oxide-semiconductor field effect transistor connected in series with the primary coil of the one of the coupled inductor or the transformer; and the alternating current-to-direct current converter comprises a diode connected in series with the secondary coil of the one of the coupled inductor or the transformer, and a capacitor connected in parallel with the one or more heating elements and across the secondary coil and the diode.

9. The substrate processing system of claim 1, further comprising a controller, wherein:

the direct current-to-alternating current converter comprises an H-bridge;

the H-bridge includes a first switch, a second switch, a third switch, and a fourth switch; and the controller is configured to transition the first switch, the second switch, the third switch, and the fourth switch between ON and OFF states when providing power to the one or more heating elements.

10. The substrate processing system of claim 9, wherein the controller is configured to:

transition the first switch and the fourth switch to an ON state while transitioning the second switch and the third switch to an OFF state; and transition the first switch and the fourth switch to an OFF state while transitioning the second switch and the third switch to an ON state.

11. The substrate processing system of claim 9, wherein:

the first switch and the second switch are connected in series; and the third switch and the fourth switch are connected in series and together are connected in parallel with the series combination of the first switch and the second switch.

12. The substrate processing system of claim 11, wherein:

the first switch and the second switch are connected to a first end of the primary coil of the one of the coupled inductor or the transformer; and the third switch and the fourth switch are connected to a second end of the primary coil of the one of the coupled inductor or the transformer.

13. The substrate processing system of claim 12, further comprising an alternating current-to-direct current converter configured to convert the second alternating current voltage to a second direct current voltage and provide the second direct current voltage to the one or more heating elements, wherein:

the primary coil receives the first alternating current voltage; and the secondary coil of the one of the coupled inductor or the transformer supplies the second alternating current voltage to the alternating current-to-direct current converter.

14. The substrate processing system of claim 12, further comprising an alternating current-to-direct current converter configured to convert the second alternating current voltage to a second direct current voltage and provide the second direct current voltage to the one or more heating elements, wherein the alternating current-to-direct current converter comprises:

a diode connected in series with the secondary coil of the one of the coupled inductor or the transformer; and a capacitor connected in parallel with the one or more heating elements and across the secondary coil and the diode.

15. The substrate processing system of claim 1, further comprising a first alternating current-to-direct current converter configured to convert the second alternating current voltage to a second direct current voltage and provide the second direct current voltage to the one or more heating elements, wherein:

the one or more heating elements comprise a first heating element;

and the secondary coil is a first secondary coil; and the first alternating current-to-direct current converter is connected to the first secondary coil and provides the second direct current voltage to the first heating element.

16. The substrate processing system of claim 15, further comprising a second alternating current-to-direct current converter, wherein:

the one or more heating elements comprise a second heating element;

the one of the coupled inductor or the transformer comprises a second secondary coil; and the second alternating current-to-direct current converter converts the first alternating current voltage to a third direct current voltage and provides the third alternating current voltage to the second heating element.

17. A substrate processing system comprising:

a substrate support configured to support a substrate, wherein the substrate support comprises one or more heating elements;

a power supply circuit comprising an input, a direct current-to-alternating current converter configured to convert a first direct current voltage received from the input to a first alternating current voltage, wherein the direct current-to-alternating current converter comprises a switch, one of a coupled inductor or a transformer comprising a primary winding and a secondary winding, wherein the primary winding is connected to the switch and directly connected to an earth ground and is not connected to a reference ground, wherein the secondary winding is connected to the reference ground and is not connected to the earth ground, wherein the reference ground is at a different voltage potential than the earth ground, and wherein the switch is connected between the input and the primary winding and supplies the first alternating current voltage to the primary winding, a diode connected in series with the secondary winding, and a capacitor connected to the diode and in parallel with the one or more heating elements, wherein the diode and the capacitor convert an alternating current output of the secondary winding to a second direct current voltage, and wherein the capacitor provides the second direct current voltage to the one or more heating elements; and a controller configured to via the switch, convert the first direct current voltage to the first alternating current voltage received by the primary winding, and transition the switch between an ON state and an OFF state at a predetermined frequency when powering the one or more heating elements.

18. The substrate processing system of claim 17, further comprising a second capacitor, wherein:

the first direct current voltage is received across the second capacitor; and the switch is connected to an output end of the second capacitor.

* * * * *